（12）United States Patent
Delzer et al.

(10) Patent No.: US 9,291,658 B2
(45) Date of Patent: Mar. 22, 2016

(54) MINIMUM-TIME SIGNAL LEAKAGE DETECTOR

(71) Applicant: Tektronix, Inc., Beaverton, OR (US)

(72) Inventors: Donald J. Delzer, Beaverton, OR (US); Gordon Alan Olsen, Tigard, OR (US)

(73) Assignee: TEKTRONIX, INC., Beaverton, OR (US)

( * ) Notice: Subject to any disclaimer, the term of this patent is extended or adjusted under 35 U.S.C. 154(b) by 103 days.

(21) Appl. No.: 13/774,222

(22) Filed: Feb. 22, 2013

(65) Prior Publication Data

US 2014/0239978 A1 Aug. 28, 2014

(51) Int. Cl.
*G01R 27/28* (2006.01)
*H04B 17/20* (2015.01)
*H04B 1/525* (2015.01)

(52) U.S. Cl.
CPC ............. *G01R 27/28* (2013.01); *H04B 17/20* (2015.01); *H04B 1/525* (2013.01)

(58) Field of Classification Search
CPC ....... H03D 7/165; H03D 3/009; H03D 3/007; H04B 1/16; H04B 1/30; H04B 1/26; H04B 1/06; H04B 1/10; H04L 25/067; G01R 27/28; G01R 31/2822; G01R 31/3191; G01R 35/005
USPC ........................................ 324/76.19, 76.23
See application file for complete search history.

(56) References Cited

U.S. PATENT DOCUMENTS

| 4,811,425 A * | 3/1989 | Feerst .......................... 455/317 |
| 5,918,167 A | 6/1999 | Tiller et al. |
| 2006/0003723 A1* | 1/2006 | Shoulders et al. ............ 455/286 |
| 2011/0092176 A1* | 4/2011 | Molnar et al. ................ 455/320 |

FOREIGN PATENT DOCUMENTS

WO 2012/126845 A1 9/2012

OTHER PUBLICATIONS

European Search Report and Written Opinion for Application No. 14156202.5, dated Apr. 4, 2014, 9 pages.
Osoba et al., "DC Offset Mitigation in Homodyne Receiver", Information, Communications and Signal Processing, 2005 Fifth International Conference on Bangkok, Thailand, Dec. 6-9, 2005, Piscataway, New Jersey, IEEE, Piscataway, NJ, Dec. 6, 2005, pp. 613-617.

* cited by examiner

*Primary Examiner* — Alesa Allgood
(74) *Attorney, Agent, or Firm* — Michael A. Nelson; Marger Johnson

(57) ABSTRACT

A device can include a radio frequency (RF) signal input, a local oscillator (LO) signal input, a mixer to receive the RF signal and LO signal and translate a frequency of the RF signal based on the LO signal, a strobe pulsing component to provide a timed strobe pulse, and a second mixer to receive a leakage signal, LO signal, and timed strobe pulse, and also to translate a frequency of the leakage signal to baseband. The device can also include a coupling component configured to allow the leakage signal to pass between the mixers. An output signal output can provide a measured value of the leakage signal.

14 Claims, 8 Drawing Sheets

US 9,291,658 B2

MINIMUM-TIME SIGNAL LEAKAGE DETECTOR

BACKGROUND

Certain types of intermediate frequency (IF) receivers, such as a zero-IF type receiver, generally include a radio frequency (RF) converter having a local oscillator (LO) frequency that is near the center of the RF input bandwidth. For such a receiver, because the LO and RF frequencies may be equal or nearly equal, it is important that the LO signal leakage out of the input of the receiver be small. However, this is difficult to achieve because the LO signal generally cannot be separated from the RF signal by filtering.

At the RF converter, the LO signal typically has a significant amplitude, and mixers usually have limited isolation from the LO port to other ports, e.g., RF and IF ports. Isolation in the mixer can be maximized by applying direct current (DC) offset current into the IF port of the mixer, and a leakage detector can be used to measure the leakage signal as part of a feedback control loop which minimizes the leakage amplitude.

To date, various types of circuits have been developed to maintain low amplitudes of LO leakage from the RF input. While each idea may have some benefits, there are also a number of associated problems. Generally, there is a detector on the RF port side of the mixer to measure leakage LO power, and the detected amplitude may be used to form correction signals through a feedback control loop.

FIG. 1 illustrates an example of a presently-used implementation 100 of a LO leakage detector. Indeed, the illustrated circuitry represents a particularly popular implementation of a leakage detector. In the example, there are two input ports (an RF input port 102 and a LO input port 104) and a mixer 112 for providing an output signal at an output signal port 114. A directional coupler 106 in the RF path transfers a portion of the reverse-travelling LO leakage signal ($F_{LO}$) to a wideband detector 108. The detected output is measured by way of an analog-to-digital converter (ADC) 110.

While the implementation illustrated by FIG. 1 has certain advantages (e.g., the leakage LO signal is usually detected and the feedback control may remain engaged), the LO leakage signal is generally lost in thermal noise of the wideband detector 108 output, and correction does not typically work to certain low amplitudes.

Accordingly, there remains a need for improved signal detection circuits and devices having an LO input.

SUMMARY

Embodiments of the disclosed technology generally include systems and devices for improved local oscillator (LO) leakage detection. Embodiments generally pertain to the detector-part of a control loop and advantageously seek to detect a low-amplitude signal with adequate noise margin in a short amount of time. Certain embodiments may include a wideband strobe-pulsed detector having a short detection time.

DETAILED DESCRIPTION

Embodiments of the disclosed technology generally pertain to fast signal detection in certain circuits and devices. Signal-to-noise ratios for a given detection speed are generally significantly better than those of presently-used implementations. Embodiments generally include a leakage detector in a local-oscillator-leakage-nulling circuit, though one having ordinary skill in the art will appreciate that other applications are feasible, such as implementations for reducing spurious signals in a frequency synthesizer.

Implementations of the disclosed technology generally use switches to directly connect the local oscillator (LO) leakage to the leakage detector while terminating the radio frequency (RF) input. The signal-to-noise ratio (SNR) of the leakage detector is generally better than with implementations in which a directional coupler is used. During the leakage detection time, the receiver is typically not active.

In order to keep from modifying the leakage amplitude, the impedance seen at the RF port of a mixer (e.g., at $F_{LO}$) should—be kept equivalent between leakage detection and normal RF conversion. This may be ensured with help from an RF attenuator, e.g., in cases where the RF input amplitude is high, or with a preamplifier, e.g., in cases where the RF input amplitude is low, or with a directional coupler.

Figure 2:
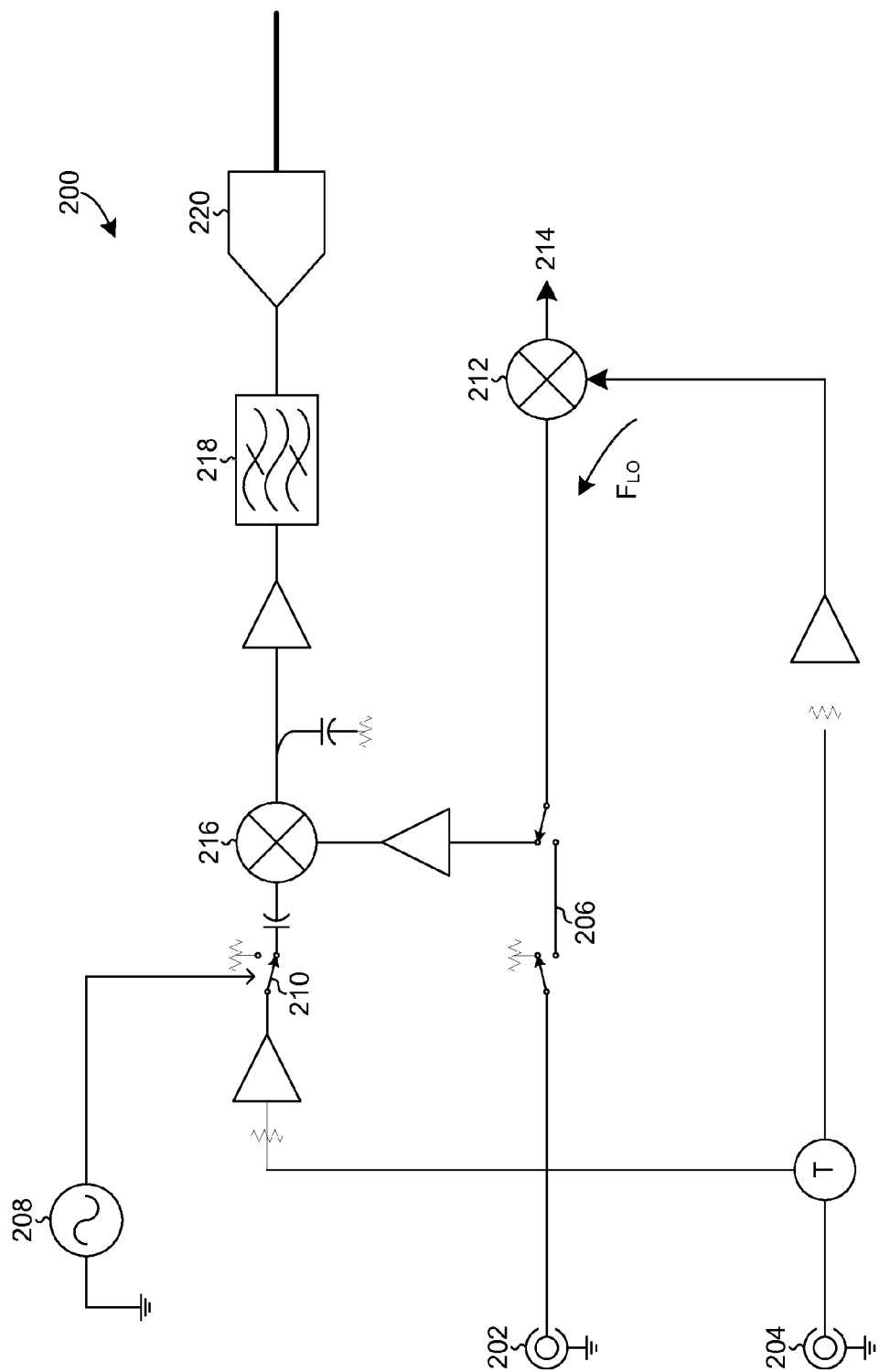
FIG. 2 illustrates a first implementation of a leakage detector in accordance with certain embodiments of the disclosed technology.

FIG. 2 illustrates a first implementation 200 of a leakage detector, in this case a chopper-modulated leakage detector. In the example, there are two input ports (an RF input port 202 and a LO input port 204), and a first mixer 212 for providing an output signal, e.g., an IF signal, at an output signal port 214. A second mixer 216 receives a copy of the LO input that is modulated by a low-RF chopping signal 208 by way of a low-frequency rate RF switch 210 or, alternatively, a mixer.

The illustrated implementation 200 uses discontinuous sampling of the leakage signal ($F_{LO}$). That is, when the leakage signal is measured, the RF input 202 is switched to a termination and the leakage signal is switched into the leakage detector by way of a first switch 206. When the chopper signal 208 is turned on, it is mixed with the copy of the LO signal by the second mixer 216. The leakage signal is then converted by the second mixer 216 to a narrow-band spectrum about the chop frequency, and that signal is subsequently digitized by an ADC 220. This implementation 200 may work particularly well for good dynamic range on the leakage detection.

Figure 1:
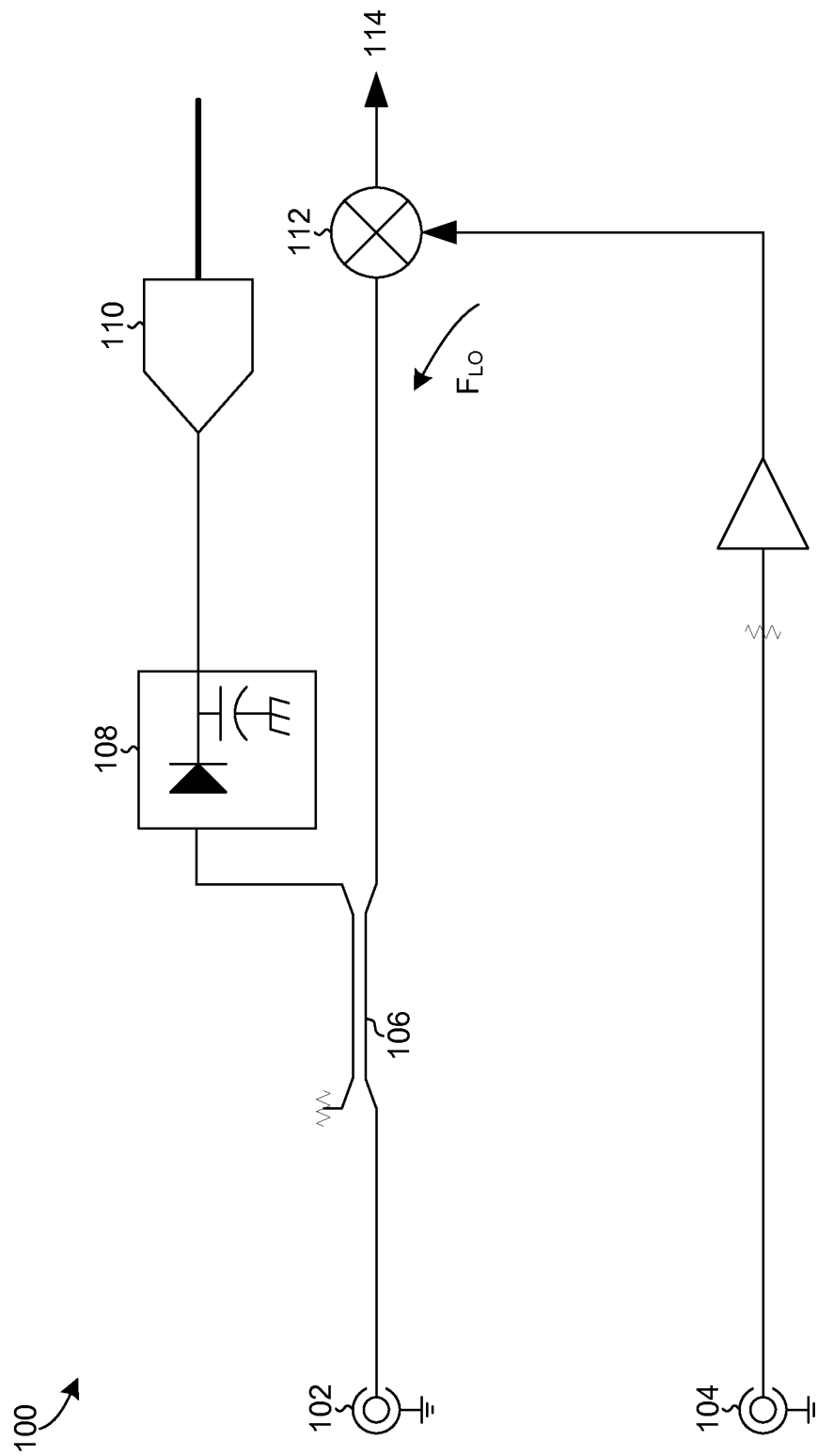
FIG. 1 illustrates an example of a presently-used implementation of a leakage detector.

Because of the LO modulation, this method can extract the LO in the presence of a wideband RF signal or broadband noise, eliminating the need for switch 206 and/or enabling the use of a directional coupler, such as the directional coupler 106 of FIG. 1.

Figure 3:
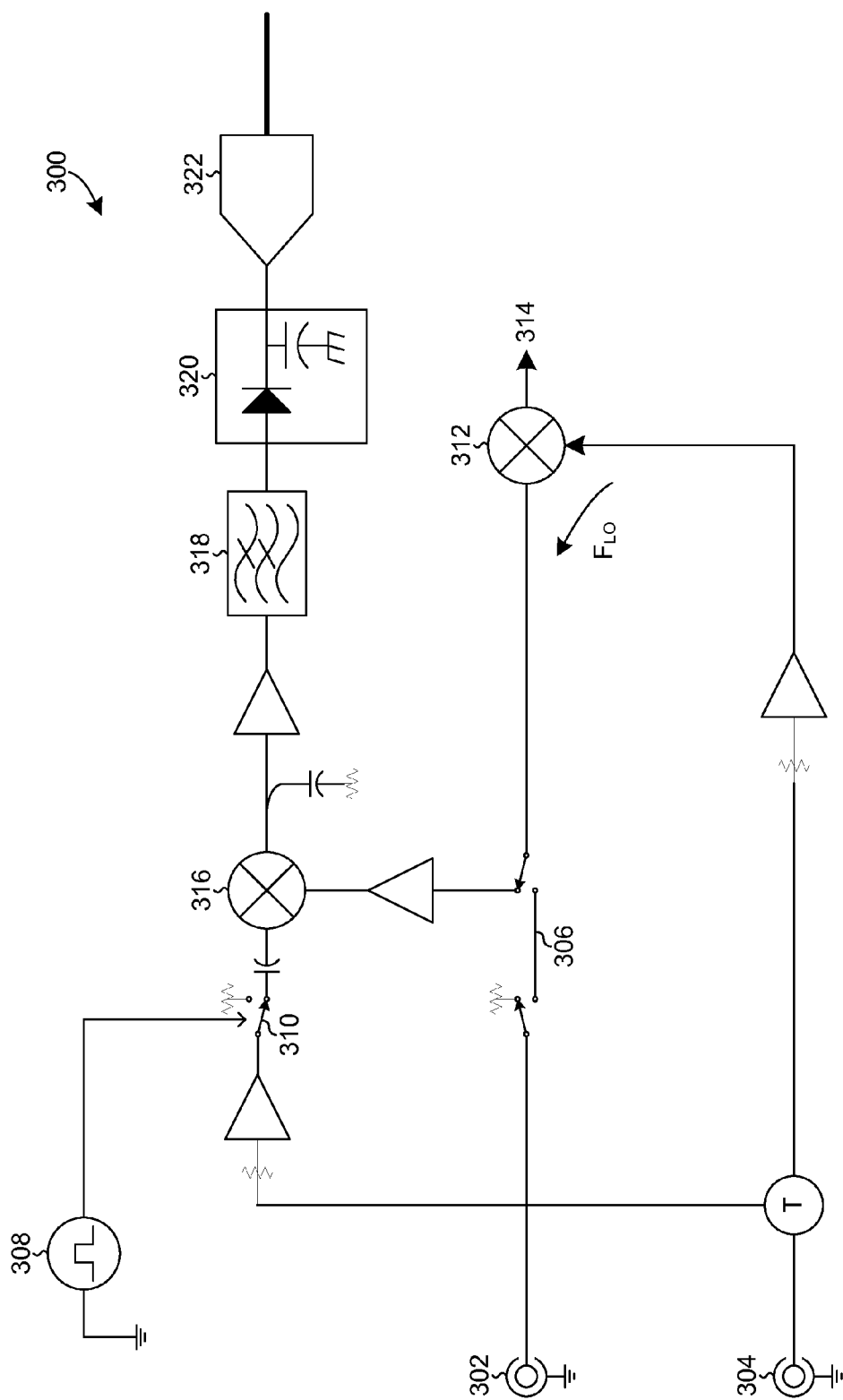
FIG. 3 illustrates a second implementation of a leakage detector in accordance with certain embodiments of the disclosed technology.

FIG. 3 illustrates a second implementation 300 of a leakage detector, in this case a strobe-pulsed leakage detector with envelope detection, in accordance with certain embodiments of the disclosed technology. This second implementation 300 is similar to the first implementation 200 illustrated by FIG. 2 in that the present implementation 300 includes two input ports (an RF input port 302 and an LO input port 304), a first mixer 312 for providing an output signal, e.g., an intermediate frequency (IF) signal, at an output signal port 314, and a chopper switch 310.

Unlike the first implementation 200, however, the chopper signal 208 has been replaced by a strobe pulse signal 308 in the presently illustrated implementation 300. Also, as noted above, the present implementation 300 includes an envelope detector 320.

The strobe pulse signal 308 width may be set to satisfy timing requirements of the chopper switch 310 plus some hold time for a stable amplitude, for example. The chopper output spectrum is generally dense about the leakage signal ($F_{LO}$). If the chopper switch 310 rise and fall times are much faster than the strobe pulse 308 width, the output spectrum is generally sin x/x. If the pulse width is not much wider than tr+tf, then output spectrum is more similar to a raised-cosine. Most of the power resides between the first nulls at f=1/T (square pulse case) where T is the width of the strobe pulse 308.

A second mixer 316 may combine the strobed LO signal with the leakage signal received from a leakage switch 306. The output spectrum is generally dense, mostly residing in the DC-to-1/T spectrum. Due to the non-linearity of the second mixer 316, the mixer output spectrum is generally not the same shape as that of the input, but most of the power resides in the bandwidth from DC to f=1/T.

An optional low-pass filter (LPF) 318 may be used to band-limit what the detector measures to preserve a good SNR. The bandwidth should generally be set to f=1/T (or a nearby cutoff frequency) and, to avoid DC errors, a high-pass filter (not shown) can also be used, so long as the high-pass cutoff is sufficiently low in frequency.

An analog-to-digital converter (ADC) 322 may acquire a single sample when the output of the envelope detector 320 is at steady-state. The time constant of the detector does not need to be faster than the filter that precedes it. In fact, the detector itself may be the device that accomplishes low-pass filtering.

In certain implementations, the chopper switch 310 may have rise and fall times of 20 nanoseconds. The strobe pulse 308 width may be 60 nanoseconds, and the detector bandwidth may be 16 MHz. In such embodiments, the leakage detection amplitude may be measured below −90 dBm, and the detection time interval may be less than 200 nanoseconds.

Figure 4:
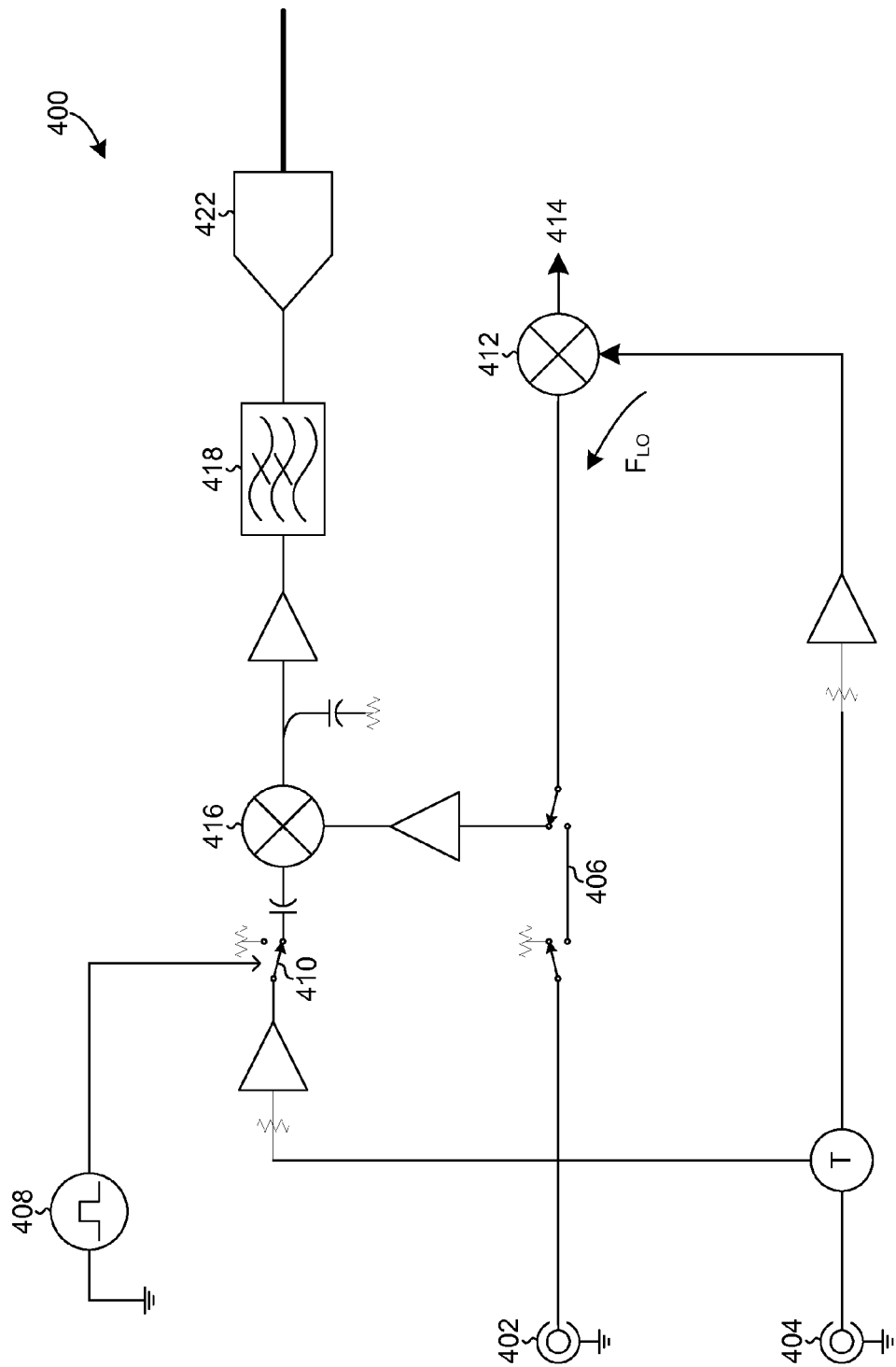
FIG. 4 illustrates a third implementation of a leakage detector in accordance with certain embodiments of the disclosed technology.

FIG. 4 illustrates a third implementation 400 of a leakage detector, in this case a strobe-pulsed leakage detector with ADC detection, in accordance with certain embodiments of the disclosed technology. This third implementation 400 is similar to the second implementation 300 illustrated by FIG. 3 in that the present implementation 400 includes two input ports (an RF input port 402 and an LO input port 404), a first mixer 412 for providing an output signal at an output signal port 414, a leakage switch 406, a strobe pulse signal 408, a chopper switch 410, and a leakage mixer 416.

Unlike the second implementation 300, however, the envelope detector 320 has been removed and the ADC 422 digitizes the output waveform of the LPF 418 in the presently illustrated implementation 400. In the example, only one ADC sample, aligned in time with the strobe pulse, is necessary; But a few ADC samples taken during the strobe pulse time is beneficial for noise suppression.

At the leakage-detector mixer 416, during the switch-on time, the leakage $F_{LO}$ is present at both inputs. The phase separation of the chopped LO and the leakage LO signals should generally be such that the mixing does not result in a near-zero output amplitude.

Figure 5:
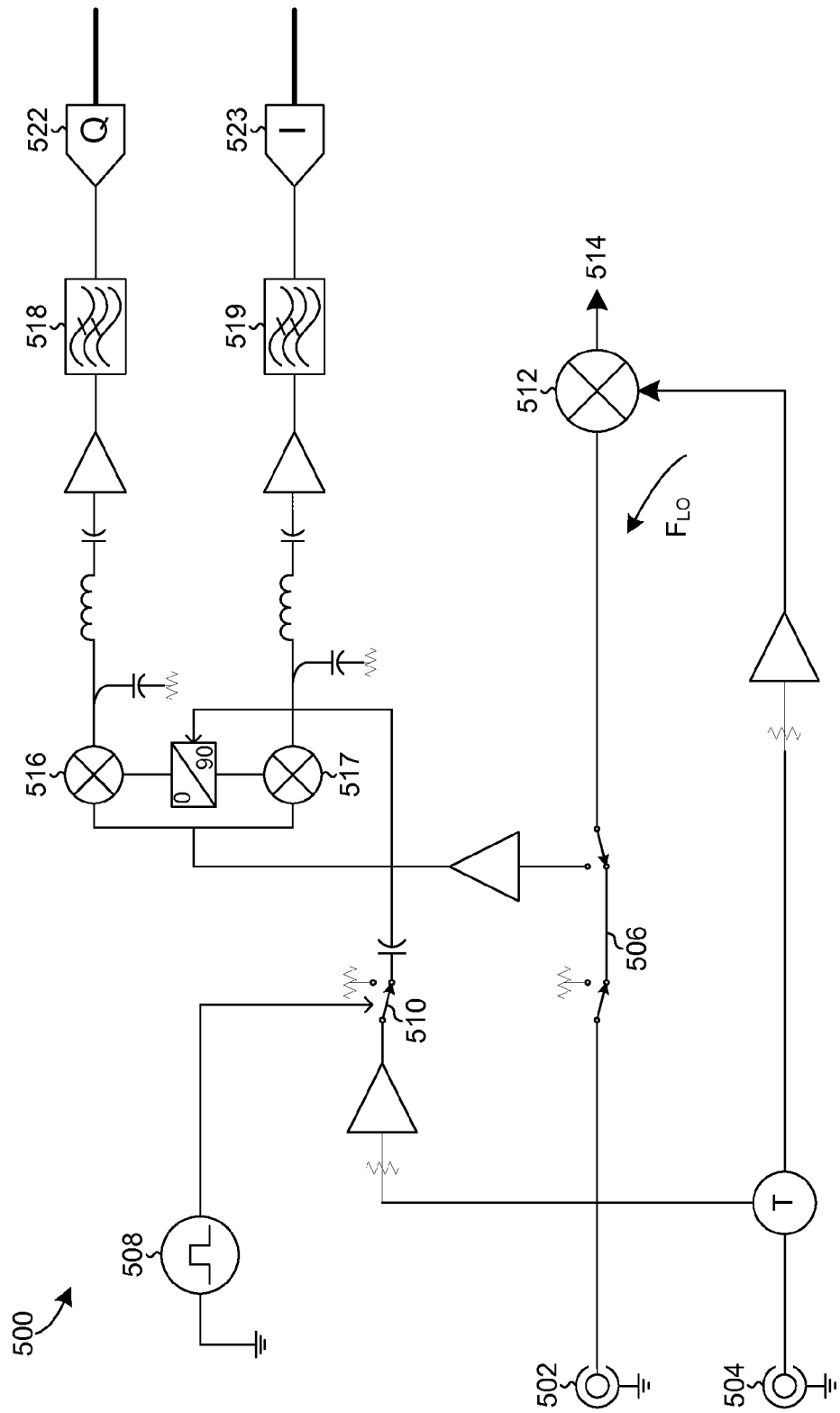
FIG. 5 illustrates a fourth implementation of a leakage detector in accordance with certain embodiments of the disclosed technology.

FIG. 5 illustrates a fourth implementation 500 of a leakage detector, in this case a strobe-pulsed leakage detector using quadrature detection, in accordance with certain embodiments of the disclosed technology. This fourth implementation 500 is similar to the second and third implementations 300 and 400 illustrated by FIGS. 3 and 4, respectively, in that the present implementation 500 includes two input ports (an RF input port 502 and an LO input port 504), a first mixer 512 for providing an output signal at an output signal port 514, a leakage switch 506, a strobe pulse signal 508, and a chopper switch 510.

Unlike the second and third implementations 300 and 400, however, the presently illustrated implementation 500 has two leakage mixers 516 and 517 and corresponding LPFs 518 and 519, respectively. The leakage conversion is split into two channels, where the LO signal to one channel is phase-shifted from the other channel by 90 degrees. Also, two ADCs 522 (Q) and 523 (I) are used to digitize the output waveforms from the filters 518 and 519, respectively. Thus, the leakage conversion may be performed using in-phase and quadrature channels, and the detected amplitude is generally the root-sum-of-squares of the I and Q values from the ADCs 523 and 522, respectively.

In some microwave receivers, it may not be practicable to expect reasonable impedance matching at the mixer RF port when the input switches are in the "detect" position compared to "through." In such situations, a directional coupler may be integrated with the strobe-pulsed receiver. The strobed receiver may thus keep the detected noise bandwidth small, and the coupler may ensure constant mixer RF port matching.

Figure 6:
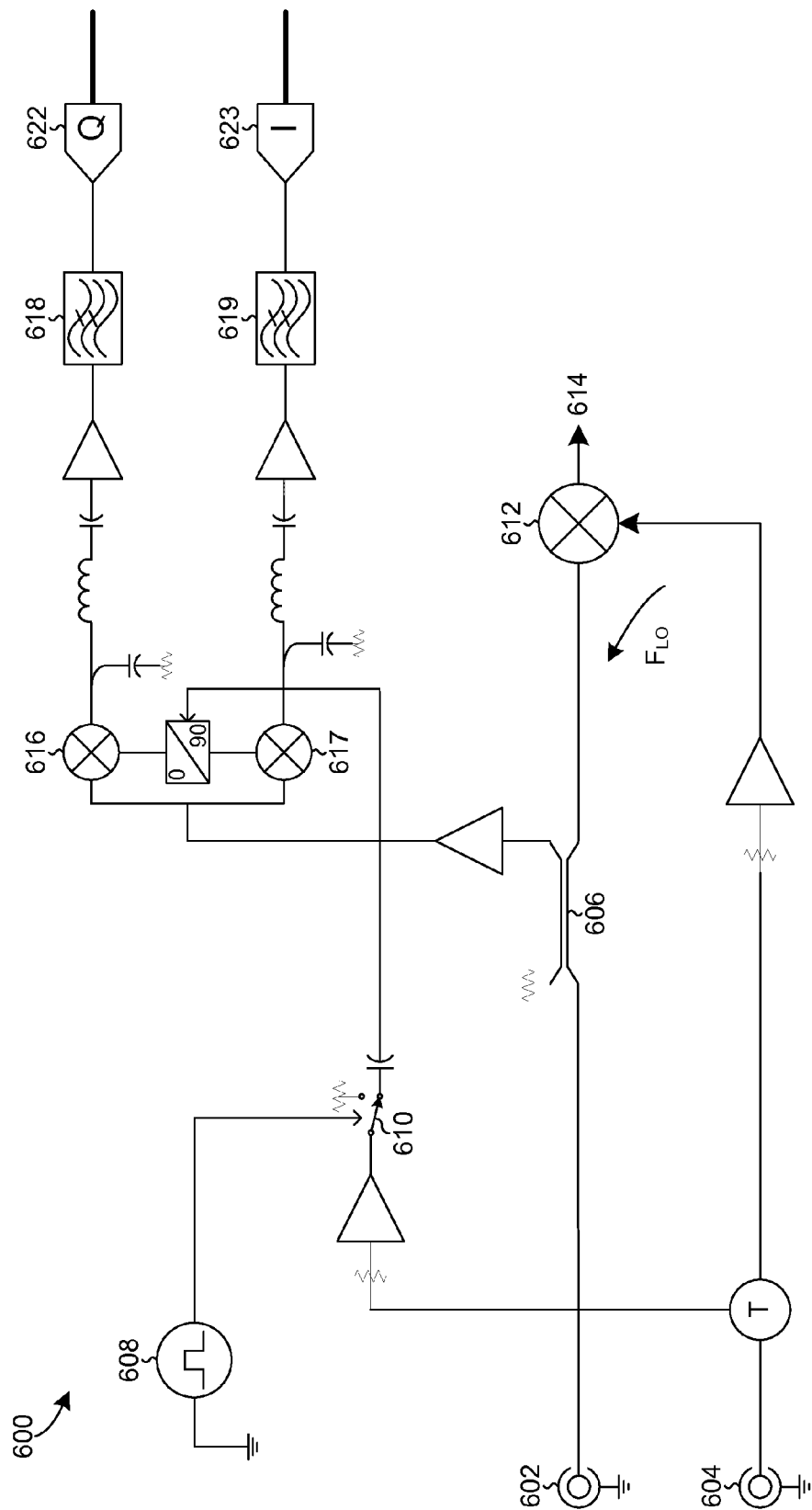
FIG. 6 illustrates a fifth implementation of a leakage detector in accordance with certain embodiments of the disclosed technology.

FIG. 6 illustrates an example of such a strobe-pulsed leakage detector using quadrature detection and directional coupler. This fifth implementation 600 is similar to the fourth implementation 500 illustrated by FIG. 5 in that the present implementation 600 includes two input ports (an RF input port 602 and an LO input port 604), a first mixer 612 for providing an output signal at an output signal port 614, a leakage switch 606, a strobe pulse signal 608, a chopper switch 610, two leakage mixers 616 and 617, two LPFs 618 and 619, and two ADCs 622 and 623.

Unlike the fourth implementation 500, however, the leakage switch 506 has been removed and replaced with a directional coupler 606 in the presently illustrated implementation 600. This arrangement may be particularly advantageous in certain situations, e.g., where the IF is non-zero and where there is enough separation such that leakage can be filtered from the RF signal in the LPFs 618 and 619 or in digital filters after the ADCs 622 and 623.

Figure 7:
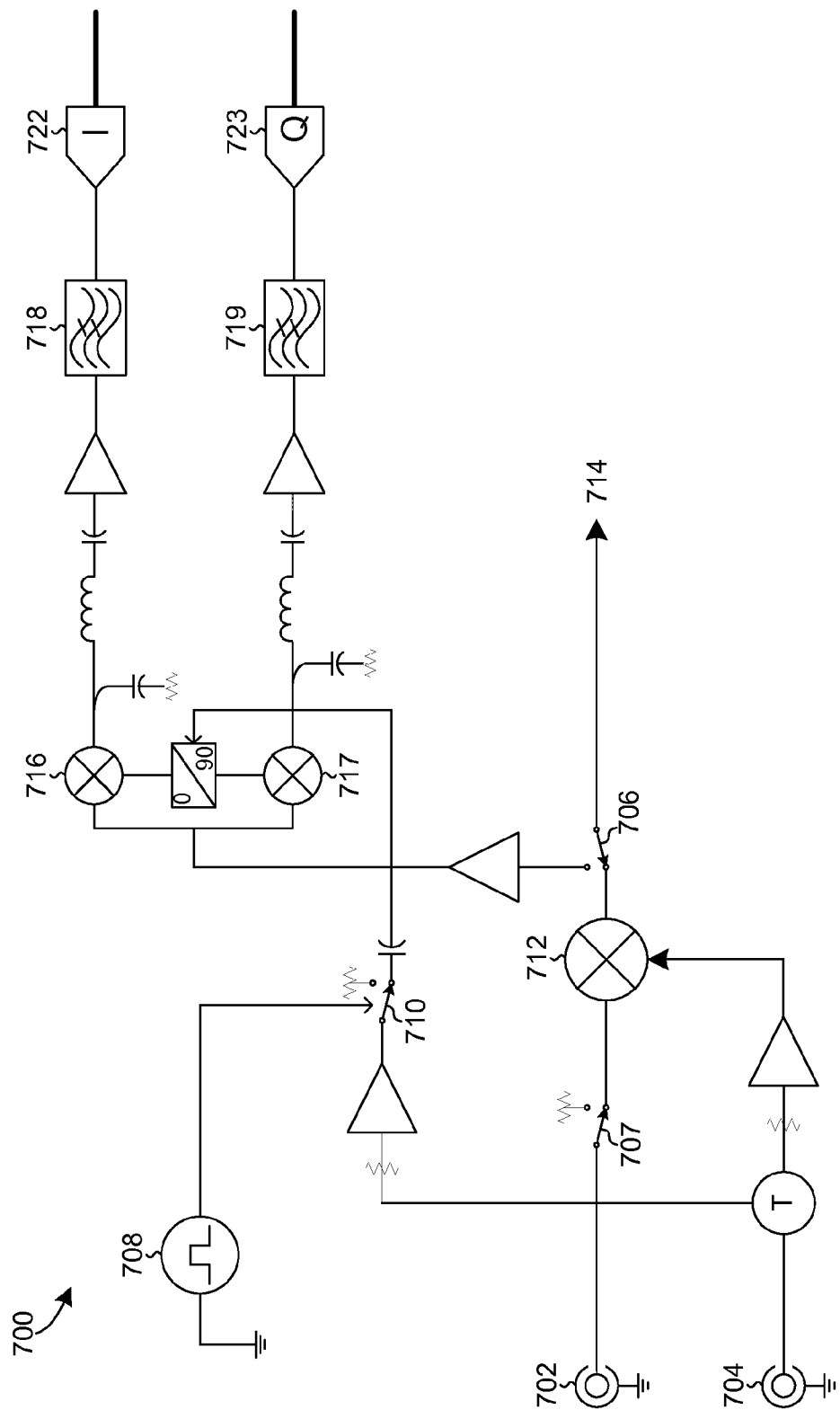
FIG. 7 illustrates a sixth implementation of a leakage detector in accordance with certain embodiments of the disclosed technology.

FIG. 7 illustrates a sixth implementation 700 of a leakage detector, in this case a strobe-pulsed leakage detector for detecting leaking in the IF path, in accordance with certain embodiments of the disclosed technology. This sixth implementation 700 is similar to the fifth implementation 600 illustrated by FIG. 6 in that the present implementation 700 includes two input ports (an RF input port 702 and an LO input port 704), a first mixer 712 for providing an output signal at an output signal port 714, a leakage switch 706, a strobe pulse signal 708, a chopper switch 710, two leakage mixers 716 and 717, two LPFs 718 and 719, and two ADCs 722 (I) and 723 (Q).

Unlike the fifth implementation 600, however, the leakage switch 706 is located at the IF side of the circuitry. This arrangement may be particularly advantageous in certain situations, e.g., where the IF frequency has a spectrum that is close to that of the LO frequency. In the example, leakage may be measured at a time interval when the RF is disconnected from the leakage mixer 712, which may be accomplished by way of another switch 707. What is measured is fed back into LO-nulling circuitry (not shown) such as DC bias current driving the mixer diodes.

Figure 8:
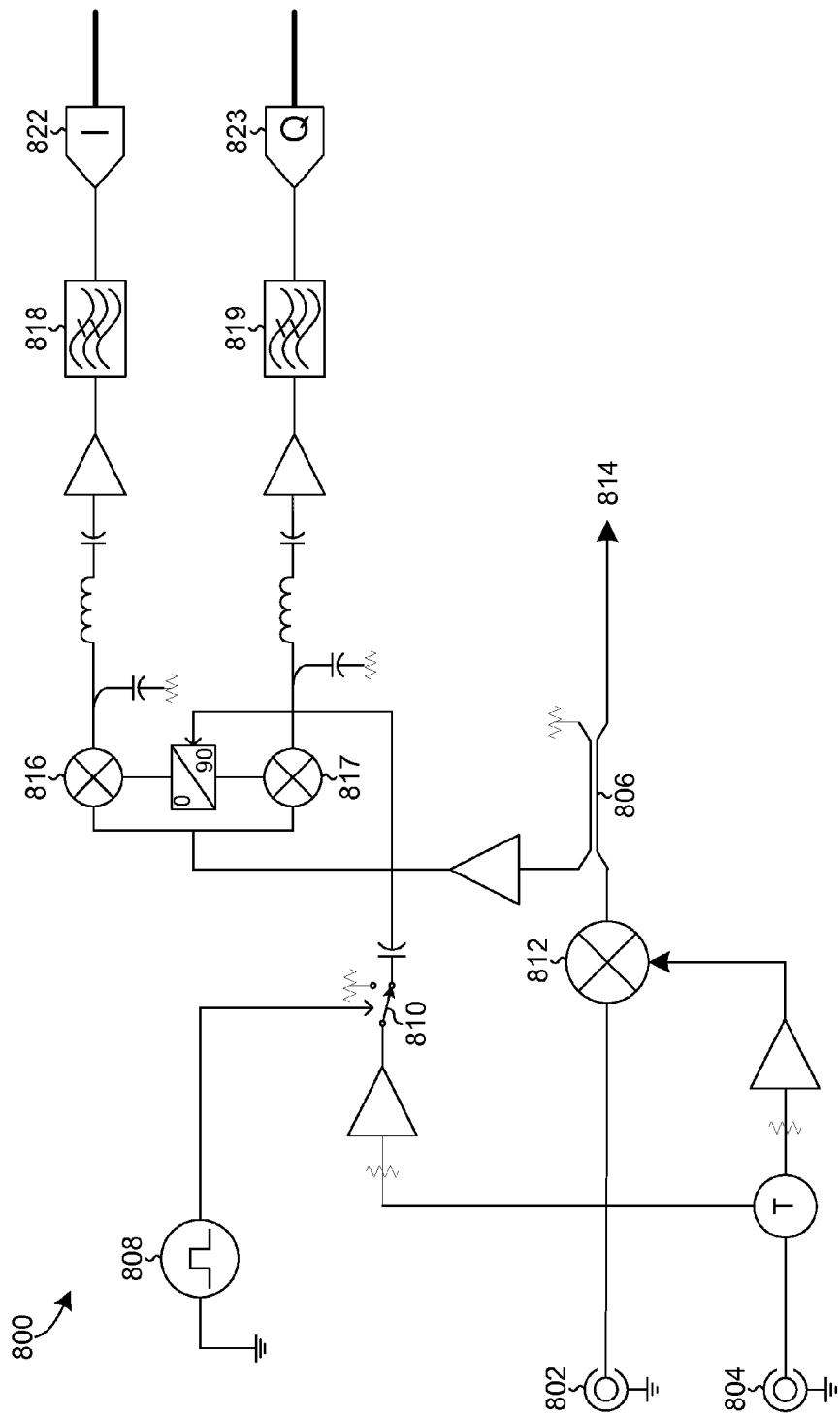
FIG. 8 illustrates a seventh implementation of a leakage detector in accordance with certain embodiments of the disclosed technology.

FIG. 8 illustrates a seventh implementation 800 of a leakage detector in accordance with certain embodiments of the disclosed technology. This seventh implementation 800 is similar to the sixth implementation 700 illustrated by FIG. 7 in that the seventh implementation 800 includes two input ports (an RF input port 802 and an LO input port 804), a first mixer 812 for providing an output signal at an output signal port 814, a leakage switch 806, a strobe pulse signal 808, a chopper switch 810, two leakage mixers 816 and 817, two LPFs 818 and 819, and two ADCs 822 and 823.

Unlike the sixth implementation 700, however, the leakage switch 706 has been removed and replaced with a directional coupler 806 in the presently illustrated implementation 800. In this arrangement, the leakage may always be measured but might not be separable from RF signals at certain low or near-zero frequencies. In such cases, however, the leakage may be measured at certain time intervals, e.g., when such signals are not present at the transmitting source or sources.

Having described and illustrated the principles of the invention with reference to illustrated embodiments, it will be recognized that the illustrated embodiments may be modified in arrangement and detail without departing from such principles, and may be combined in any desired manner. And although the foregoing discussion has focused on particular embodiments, other configurations are contemplated. In particular, even though expressions such as "according to an embodiment of the invention" or the like are used herein, these phrases are meant to generally reference embodiment possibilities, and are not intended to limit the invention to particular embodiment configurations. As used herein, these terms may reference the same or different embodiments that are combinable into other embodiments.

Consequently, in view of the wide variety of permutations to the embodiments described herein, this detailed description and accompanying material is intended to be illustrative only, and should not be taken as limiting the scope of the invention. What is claimed as the invention, therefore, is all such modifications as may come within the scope and spirit of the following claims and equivalents thereto.

The invention claimed is:

1. A device, comprising:
    an input signal input configured to receive an input signal;
    a local oscillator (LO) signal input configured to receive an LO signal;
    a first mixing component configured to receive the input signal and LO signal and translate a frequency of the input signal based on the LO signal;
    a chopper signal component configured to provide a chopping signal;
    a second mixing component configured to receive a leakage signal from the first mixing component, the LO signal, and the chopping signal, and further to translate a frequency of the leakage signal to baseband;
    a switch positioned at an input signal side of the first mixing component, the switch configured to selectively allow the leakage signal to pass from the first mixing component to the second mixing component and, when the leakage signal is selectively allowed to pass from the first mixing component to the second mixing component, to disconnect the input signal input from the first mixing component; and
    a signal output configured to provide a measured value corresponding to the leakage signal.

2. The device of claim 1, wherein the chopper signal component is configured to provide a single chopping signal to the second mixing component.

3. The device of claim 1, wherein the chopper signal component is configured to provide a plurality of sequential chopping signals to the second mixing component.

4. The device of claim 1, further comprising an analog-to-digital converter (ADC) configured to digitize the measured value.

5. The device of claim 1, wherein the second mixing component comprises a single mixer.

6. The device of claim 1, wherein the input signal is a radio frequency (RF) signal.

7. The device of claim 1, further comprising a low-pass filter (LPF) configured to band-limit the measured value.

8. The device of claim 7, wherein the LPF can be implemented in analog domain or digital domain.

9. A device, comprising:
    an input signal input configured to receive an input signal;
    a local oscillator (LO) signal input configured to receive an LO signal;
    a first mixing component configured to receive the input signal and the LO signal and translate a frequency of the input signal based on the LO signal;
    a strobe-pulse signal component configured to provide a strobe-pulsed signal;
    a second mixing component configured to receive a leakage signal from the first mixing component, the LO signal from the LO signal input, and the strobe-pulsed signal from the strobe-pulse signal component, and further to translate a frequency of the leakage signal to baseband;
    a switch positioned at an input signal side of the first mixing component, the switch configured to selectively allow the leakage signal to pass from the first mixing component to the second mixing component and, when the leakage signal is selectively allowed to pass from the first mixing component to the second mixing component, to disconnect the input signal input from the first mixing component; and
    a signal output configured to provide a measured value corresponding to the leakage signal.

10. The device of claim 9, wherein the strobe-pulse signal component is configured to provide a single strobe-pulsed signal to the second mixing component.

11. The device of claim 9, wherein the strobe-pulse signal component is configured to provide a plurality of sequential strobe-pulse signals to the second mixing component.

12. The device of claim 9, further comprising an analog-to-digital converter (ADC) configured to digitize the measured value.

13. The device of claim 9, further comprising a low-pass filter (LPF) configured to band-limit the measured value.

14. The device of claim 9, wherein the input signal is a radio frequency (RF) signal.

* * * * *